United States Patent [19]

Bankes et al.

[11] 4,282,908
[45] Aug. 11, 1981

[54] TRANSFERRING AND TRANSPORTING ELONGATED MAGNETIC ARTICLES FOR TREATMENT SUCH AS LEAD STRAIGHTENING

[75] Inventors: Kristen E. Bankes, Reading; Anderson F. Johnson, Jr., Sinking Spring; Donald M. Large, Temple; Fred J. Reinhard, Reading, all of Pa.

[73] Assignee: Western Electric Co., Inc., New York, N.Y.

[21] Appl. No.: 72,255

[22] Filed: Sep. 4, 1979

[51] Int. Cl.³ .............................................. B21F 1/02
[52] U.S. Cl. .................................... 140/147; 198/690
[58] Field of Search ................. 140/147; 198/443, 619, 198/690

[56] References Cited

U.S. PATENT DOCUMENTS

| | | | |
|---|---|---|---|
| 2,867,262 | 1/1959 | Ainsworth et al. | 140/147 X |
| 3,537,580 | 11/1970 | Beroset et al. | 198/690 X |
| 3,731,783 | 5/1973 | Dreher et al. | 198/690 X |
| 3,799,216 | 3/1974 | Kopczynski | 140/147 |
| 3,875,978 | 4/1975 | Kopczynski | 140/147 |

OTHER PUBLICATIONS

"Air Jets for Magnetic Feeder" by Herman et al., Western Electric Technical Digest No. 24, Oct. 1971, p. 17.
"Magnetic Suspension Parts Handling" by Beroset et al., The Western Electric Engineer, Jul. 1967, vol. XI, No. 3, pp. 36–42.

Primary Examiner—Richard B. Lazarus
Attorney, Agent, or Firm—D. C. Watson; G. W. Houseweart

[57] ABSTRACT

Elongated magnetic articles 12 are transferred directly from a magnetic bin 17 and transported on a member 80 having deep slots 84 to retain the articles 12 for treatment. In a preferred example, the articles 12 include some articles 13 having undesirably shaped leads 14 and the treatment comprises lead straightening.

A system of magnets 30 generates a magnetic field in the bin 17 which suspends and orients a supply of the articles 12 and 13 such that a dense, rotating pattern of articles is formed and urged against member 80. A pair of supports 57 and 58 limit the depth of the slots 84 at a first level to prevent more than one article 12 or 13 to enter therein. As an entered article 12 or 13 advances beyond the supply of articles, the supports 57 and 58 are discontinued and the entered article moves to a second level.

Portions of the magnets in the bin 17 are advantageously extended, without discontinuities, along the edges of the transport area to form a system of magnets 34 which communicates from end to end of the articles 12 and 13 as they are advanced along the first and second levels. A system of magnets 70 generates a magnetic field directed inwardly of the slots 84 to attract the articles 12 and 13 to the first level and another system of magnets 55 generates a magnetic field transversely of member 80 to stabilize the articles in the slots 84. System 70 also generates a series of inwardly directed magnetic fields to attract the articles 12 and 13 and to retain them at the second level until they reach the treatment area.

24 Claims, 7 Drawing Figures

TRANSFERRING AND TRANSPORTING ELONGATED MAGNETIC ARTICLES FOR TREATMENT SUCH AS LEAD STRAIGHTENING

TECHNICAL FIELD

This invention relates to transferring and transporting elongated, magnetic articles such as diodes, typically having a generally central body with two opposing leads extending therefrom. The invention further relates to successively transferring and transporting such articles for treatment which requires rugged retention of the articles on a transport member such as, for example, in lead straightening.

BACKGROUND OF THE INVENTION

High speed lines are now being installed in the electronic industry to produce elongated, often magnetic devices in large quantities and at reduced costs. Such devices may comprise resistors, capacitors, varistors and diodes, quite often in the form of axially leaded devices. It is desirable that the leads of such devices be substantially straight when they are tested and later inserted into P-C boards. On the other hand, the assembly operations often cause the leads of such articles to be bent or deformed to such an extent that such leads should be straightened to make the articles usable.

Lead straightening generally relates to a recognized principle that when a nonlinear wire section is pressed between two opposing surfaces and one or both surfaces are translated, the section is rolled and tends to become straightened. When applying the rolling principle to articles having a body with opposing leads, it is advantageous to engage the leads close to the body and to progressively and simultaneously roll each lead away from such body. Many machines implement this combined principle, the major differences in the machines being in the means for transferring and transporting the articles through a straightening means.

It will be appreciated that substantial forces are applied to the leads by the engaging surfaces as such leads are rolled under pressure therebetween. These forces are desirably resisted by rugged means of article retention in order to maintain the elongated dimension of the articles transverse to the direction in which the articles are advanced.

Several different machines are employed to straighten leads in accordance with the above considerations. Some do an excellent job at relatively high efficiency but with low rates of production. By high efficiency it is meant that the machine cleanly picks up only one article at nearly every transfer movement, retains nearly every article as the articles are transport through the straightening means and delivers nearly every article in good condition after the leads have been straightened. Typically, this type of machine is complicated, costly to build and costly to maintain.

On the other hand, there are high speed machines available which are normally of moderate to low efficiency. A typical machine of this type is sold by B. Graule and Company K.G., of 1 Berlin 10, Helmholtzstr. 2-9, Germany, hereinafter called the "Graule" unit or straightener. The Graule unit is uncomplicated, relatively inexpensive and can be made to run over a wide range of speeds. However, conventional methods of orienting and feeding the articles into the deep slots required to retain the articles in the Graule unit usually limit the speed and efficiency of the operation.

In the past, the elongated articles were channelled by various means into raceways to maintain article orientation. From the raceways the articles were fed either directly onto a rotary transport member of a Graule unit or they were fed onto a transfer wheel which then fed the articles onto the transport member. These mechanisms were costly to build, costly to maintain and slow in operation. Later, magnetic bins were introduced to advantageously orient the articles.

Such bins are inexpensive to build and easy to fill because the magnetic field of the bin keeps the articles oriented when they are dumped from a handling box. Moreover, orientation is maintained even when the bin is not full so it has become common practice to feed transfer wheels directly from magnetic bins. This development has improved the cost and efficiency of Graule lead straightening but has done little to improve the speed of article transfer.

SUMMARY OF THE INVENTION

In view of the foregoing, it is an object of this invention to provide improved methods and apparatus for transferring and transporting elongated, magnetic articles for treatment such as lead straightening.

With this and other objects in mind, the present invention includes the step of orienting a supply of such articles so the elongated dimension of each article is transverse to a given direction in which said articles are to be transported. A transport member is advanced in the given direction in communication with the supply of articles to permit the articles to be urged into successive slots in the member. The articles are magnetically attracted into the slots where they are supported and stabilized at a first level sufficient to prevent more than a predetermined number of articles from entering each of the slots. Then, as the entered articles are advanced by the transport member beyond the supply of articles, the support of such entered articles at the first level is removed and the articles are magnetically attracted to move further into the slots to a predetermined second level.

BRIEF DESCRIPTION OF THE DRAWING

Other objects and advantages of the invention will be more readily understood from the following detailed description when read in conjunction with the accompanying drawing, wherein.

Figure 1:
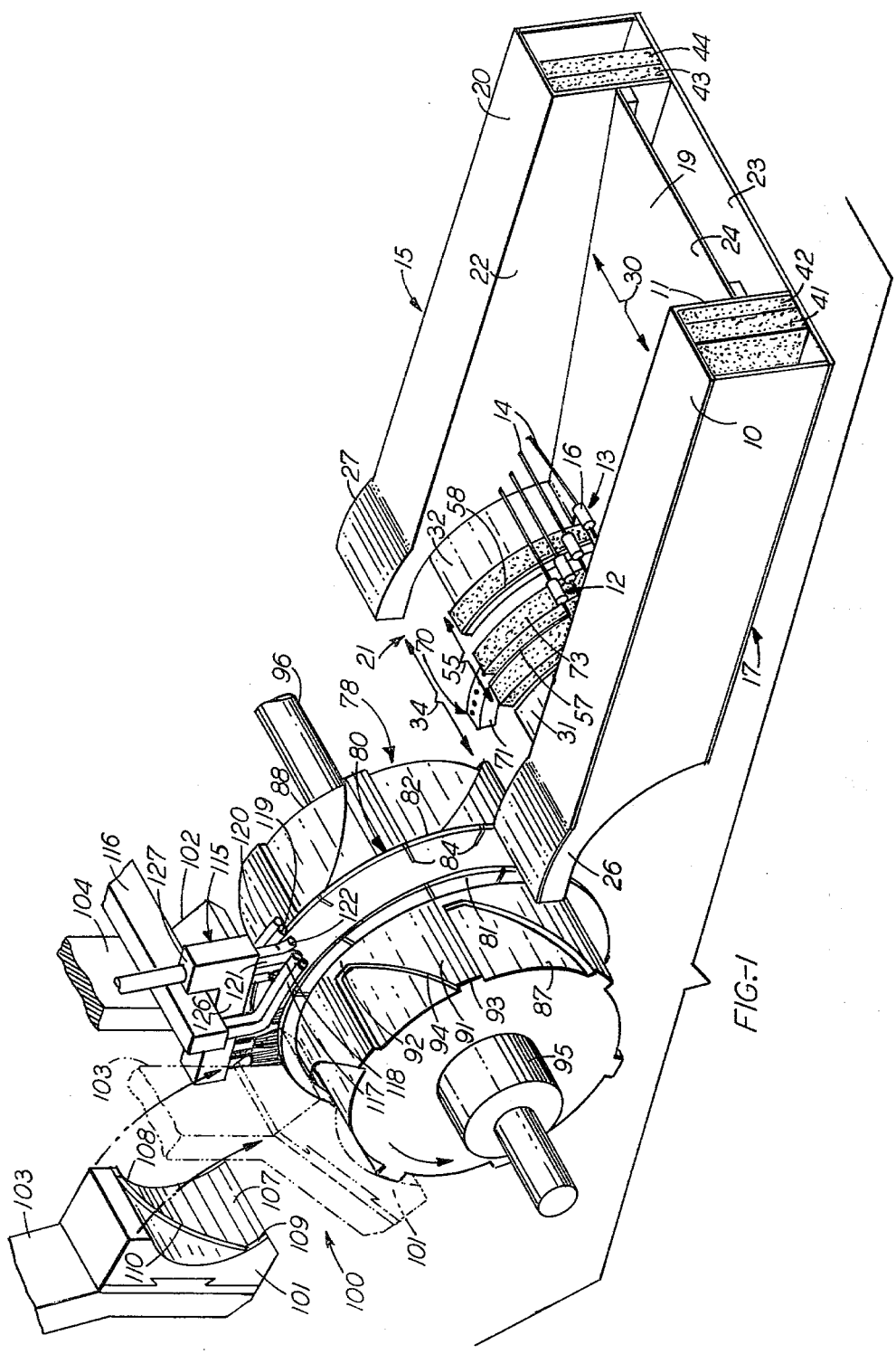
FIG. 1 is a partially exploded view of major portions of a lead straightening machine illustrating a preferred embodiment of the instant invention.

For clarity and to promote a better understanding of the invention, the various figures are schematically simplified to highlight various aspects and features of the invention. Also, where appropriate, the same reference numerals have been repeated in the various figures to designate corresponding features in the drawing.

DETAILED DESCRIPTION

The Elongated Magnetic Articles

In FIG. 1 there are shown several articles 12 which are to be transferred and transported for treatment such as lead straightening as will be described in more detail hereinafter. For purposes of illustration, the articles 12 will be identified and referred to as axially leaded diodes. However, it will be appreciated that other elongated, magnetic articles, such as, without limitation, resistors, capacitors or varistors can as well be transferred and transported for treatment in accordance with this invention.

Referring again to FIG. 1, the diodes 12 have wire-like leads 14 which extend in opposite directions from a central body 16. In a preferred example, which will be used hereinafter unless otherwise specified, a typical diode 12 is selected which measures about 3.375 inches long and weighs about 0.243 grams. The wire leads 14 are about 0.020 inches in diameter and each is about 1.563 inches long. The body 16 is located about the center of the diode 12 and such body is cylindrical, being about 0.120 inches in diameter and about 0.250 inches long. The body 16 contains an electronic device (not shown) comprising two opposing studs with a semiconductor wafer sandwiched between the flat faces of the studs. An end of a lead 14 is attached to each stud and the two studs, the wafer and short sections of the leads 14 are enclosed in a casting of plastic to form the body 16. The studs and the leads 14 are made of a magnetic material, i.e., a material which is attracted to a magnet. Therefore, the body 16 and the leads 14 are responsive to magnetic forces and magnetic means are advantageously used to manipulate the diodes.

The diodes 12, shown in FIG. 1, have desirably straight or axially symmetrical shapes while at least one diode 13 is shown having a lead 14 which is bent away from a theoretical straight axis drawn through the cylindrical body 16 of such diode. The leads 14 are quite susceptible to being bent or deformed in the course of manufacture of such diodes 12. However, it is desirable that the leads of such diodes be nearly straight for testing and for end use. It has, therefore, become customary for manufacturers to run all axially leaded diodes through lead straightening as a preventative measure after the diodes are assembled and before such diodes are further processed.

The Lead Straightening Machine

FIG. 1 shows a partially exploded view of portions of a lead straightening machine which illustrates a preferred embodiment of the instant invention. The major components of the machine are a feed section 15 which stores and orients a supply of articles 12 and 13 and which urges such articles into communication with a rotary section 78. Such section 78 receives the articles from the feed section 15 and transports them in a counterclockwise direction in communication with an overhead air and brush section 115 and a stationary lead engaging section 100. The air and brush section 115 functions to seat the articles 12 in the rotary section 78 and to retain the articles therein until they pass between the rotary section 78 and the stationary section 100. The rotary section 78 and the stationary section 100 are typical of components which are sold by the aforementioned B. Graule and Company K.G. and they are designated in combination herein as the "Graule" straightening head. Comparable features of the Graule head are believed to be originally disclosed in U.S. Pat. No. 2,867,262 to J. R. Ainsworth et al. Such patent is hereby incorporated by reference into this application and the patentee will hereinafter be referred to as "Ainsworth."

Several different methods are known to feed articles onto a rotary section of a Graule type head for lead straightening. Ainsworth teaches that a wheel comprising spaced parallel discs having peripheral slots can be used to carry the articles to slots in the rotary section. The wheel is seen to be a transfer mechanism which is loaded by undisclosed means and such wheel can be arrested if necessary to align the slots with the slots on the rotary section. No means are disclosed for storing and orienting the articles or for loading them onto the transfer mechanism.

A vertical raceway and a transfer wheel are sold by B. Graule and Company K.G. to orient and feed the articles to a Graule type head such as that shown in FIG. 1. Other manufacturers have used magnetic means for storing, orienting and feeding the articles. For example, a magnetic bin has been used for these functions in combination with a magnetically fitted transfer wheel. A machine having these features is sold by G.T.I. Corporation of Hadley, Penn., such as, for example, its Model 60, said to process 20,000 articles per hour. It is believed, however, that heretofore no one has disclosed or suggested a method or apparatus for feeding a Graule type head directly from a magnetic bin.

The Rotary Section

The rotary section 78, shown in FIG. 1, comprises a transport member designated generally by the numeral 80 and a pair of rotary lead engaging members 87 and 88. The transport member 80 is rotatably mounted on a shaft 96 and both rotary lead engaging members 87 and 88 are also mounted on shaft 96, one on either side of the member 80.

The transport member 80 includes further two spaced, parallel guide discs 81 and 82. Separation means, not shown, are provided between the discs 81 and 82 to hold them apart a fixed spacing suitable to accommodate a body 16 of a diode 12. For example, a spacing of about 0.406 inches is found to be suitable for a 3.375 inches long diode having a 0.250 inches long body according to the preferred example.

The guide discs 81 and 82 are larger in diameter than the rotary members 87 and 88 and each disc protrudes radially outward from the surface of an adjacent rotary member by about 0.313 inches. The guide discs 81 and 82 are equipped with slots 84 cut radially into the perimeter of each disc. Each slot 84 in the disc 81 is located directly opposite a respective slot 84 provided in the disc 82. A pair of opposing slots 84 are thus formed to accommodate the leads 14 of a diode 12 with a body 16 suspended between the slots 84.

For a diode 12 having leads 14 which measure about 0.020 inches in diameter, the slots 84 are advantageously about 0.063 inches in width. On the transport member 80 shown in FIG. 1 there are 12 pairs of opposing slots, each pair to accommodate one diode 12 and to hold such diode transverse to the direction in which the transport member 80 rotates between the rotary members 87 and 88.

On the periphery of each rotary member 87 and 88 there are formed a series of successively connected, raised surfaces 91. Each surface 91 has a leading, narrow end 92 and a trailing, wider end 93, taken with respect to the direction of rotation of the members 87 and 88. Each narrow end 92 is disposed adjacent to a guide disc 81 or 82 and the surface 91 tapers therefrom along a raised edge 94 to the wider end 93. Each of the surfaces 91 cooperates with complimentary surfaces in the stationary section 100 to engage the leads of an article therebetween.

The Stationary Section

The stationary section 100 comprises two lead engaging shoes 101 and 102 which are supported respectively by two arms 103 and 104. Each arm 103 and 104 is pivotally mounted to a shaft (not shown) which permits the shoes 101 and 102 to yieldingly cooperate with the rotary section 78 to engage the leads 14 of a diode 12 or 13. Pressure is adjustably applied to each shoe 101 and 102 by means (not shown) acting in accordance with the arrow shown pointing to shoe 101.

The lead engaging portion of the shoes 101 and 102 will be described by reference to shoe 101 only; however, it will be appreciated that shoe 102 has a similar lead engaging portion to that of shoe 101 but that said portion is disposed in an opposite hand manner. The lead engaging portion of shoe 101 is provided in a concave shape to complement and accommodate the convex shape of the rotary lead engaging member 87. On the concave shape there is provided a raised surface 107 having a narrow end 108 and a wider end 109. When sections 100 and 78 are assembled, the narrow end 108 of surface 107 is disposed adjacent to the guide disc 81, and the surface 107 tapers therefrom along a raised edge 110 to the wide end 109. It can be seen that surface 107 is arranged with the narrow end 108 directed upward toward the air and brush section 115. Therefore, when a surface 91 on the rotary member 87 is advanced to the shoe 101 the narrow end 92 of such surface 91 registers first with the narrow end 108 of surface 107. Thereafter, in a straightening cycle, an increasingly wider portion of a surface 91 incrementally engages with an increasingly wider portion of the surface 107 upon a lead 14 of an article 12. On completion of the straightening cycle the wide end 109 of a surface 107 engages with a wide end 93 of a surface 91 upon the full length of a lead 14 and the article 12 then exits the stationary straightening section 100.

According to the laws of motion, the surfaces 91 should move at twice the speed of a rolling article 12 as such article passes through the straightening cycle. Therefore, there are six of the fast moving surfaces 91 to accommodate twelve of the slower moving pairs of article-retaining slots 84. The transport member 80 is therefore driven by use of reducing gears (not shown) located within the rotary section 78 to transport the articles through section 100 where the lead straightening process takes place.

It will be appreciated that substantial forces are at work in the lead straightening process. Such forces may cause vibrations and similar disturbing conditions which may be transmitted to the slots 84 of the transport member 80. At the slots 84 such vibratory conditions tend to dislodge articles which are marginally entered in the slots 84. Unevenness of speed and magnetic forces also cause dislodging conditions at the slots 84. It is, therefore, desirable to stabilize the articles 12 in the slots 84 to overcome such conditions at the transport member 80 and to thereby improve the efficiency of article transfer from the feed section 15.

The Feed Section

A large component of the feed section 15 is a magnetic bin 17 shown in FIG. 1. The bin 17 is advantageously formed of material which is nonmagnetic and which will withstand mechanical abrasion caused by the articles 12 and 13 which move therethrough. A preferred material having such properties is a nonmagnetic stainless steel sheet formed into the mechanical assembly shown in FIG. 1. The bin 17 has two spaced side members 10 and 20 joined to a bottom member 23 to form a rectangular channel which supports other components. The side members 10 and 20 have confronting sidewalls 11 and 22, respectively, which are typically spaced apart a distance slightly greater than the length of a diode 12 measured between the outer tips of the leads 14. For example, given a diode 12 having an overall length of about 3.375 inches, the distance between the sidewalls 11 and 22 may be set at about 3.438 inches. This setting provides suitable fabrication tolerances for both the diodes 12 and the bin 17.

The bin is made sufficiently long to accommodate an ample supply of the diodes 12 and 13 or to connect the bin 17 to other bin sections (not shown) which receive the diodes and feed them to the bin 17. A raised, sloping floor member 24 is provided between sidewalls 11 and 22 and the bin assembly 17 is additionally pitched from an inlet end 19 downward to an outlet end 21 to urge the diodes 12 into contact with the rotary section 78 when the machine is assembled.

To accommodate the rotary section 78, each side member 10 and 20 is formed into an arcuate shape, designated 26 and 27, respectively, at the outlet end 21 of the bin 17. Also, two arcuately shaped floor members 31 and 32 are made to fit partially over the rotary members 87 and 88, respectively, to prevent premature rolling contact with the leads 14 of the articles until such articles are properly seated in the slots 84 of transport member 80. Such premature contact is found to be particularly detrimental when a lead 14 of a bent article 13 contacts a raised edge 94 of a rolling surface 91. A lead 14 can be deformed into a spring and released whereby the article 13 is expelled from the slots 84 to disturb the supply of articles in the bin 17 and to adversely effect the transfer of such articles.

The arcuately shaped features of the bin 17 accommodate the rotary section 78 and the rotary transport member 80 penetrates to about 0.375 inches into the magnetic part of the bin 17 measured from the end 21. It is believed that heretofore no one has disclosed such shallow penetration by a rotary member for transferring articles from a magnetic bin. Yet this arrangement has been found advantageous for transferring articles onto a deep slotted transport member, especially in cooperation with various systems of magnets which enhance the functions performed by feed section 15 and rotary section 78.

The systems of magnets will be described herein primarily with regard to the functions each system is seen to perform or to enhance. However, it is to be understood that the functions performed by some of the systems overlap each other and these functions may also overlap the functions performed by nonmagnetic features and aspects of the invention.

The Orienting Magnetic Field

The side members 10 and 20 of the bin 17 support a system of magnets which is designated generally by the numeral 30 in FIG. 1. The primary function of the system 30 is to suspend and orient the articles 12 and 13 between the sidewalls 11 and 22 so the articles are substantially parallel to one another and so they are transverse to the direction in which such articles are to be advanced. Another function of system 30 is to gather the oriented articles into a dense pattern in communication with the transport member 80. It will be further seen that system 30 functions in unique cooperation with other systems of magnets to efficiently transfer the articles from the feed section 15 to the rotary section 78.

Figure 2:
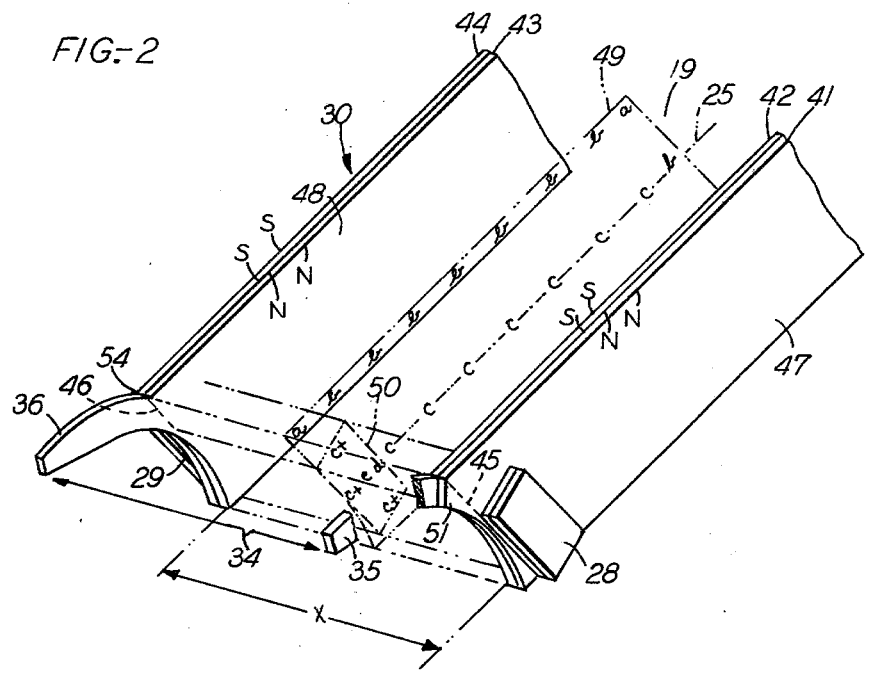
FIG. 2 is a pictorial view of a system of magnets from the machine shown in FIG. 1 for orienting elongated articles in a feed bin.

FIG. 2 is a pictorial view further illustrating the system of magnets 30 and additionally illustrating another system of magnets 34. Note that there are two magnets 41 and 42 which function as a composite unit 47 in side member 10 and there are also two magnets 43 and 44 which function as a composite unit 48 in side member 20 of the bin 17. The magnets 41 and 42 and the magnets 43 and 44 extend as two composite units for substantially the full length of side members 10 and 20, respectively. However, magnets 42 and 43 each extend completely into the arcuate bin extensions 26 and 27 (FIG. 1), respectively, of side members 10 and 20 to form arcuate side magnets 35 and 36 on either side of the rotary section 78. As seen in FIG. 2, magnets 41 and 44 extend only partially, as portions 51 and 54, into the bin extensions.

A theoretical line 45 has been drawn to separate the composite unit formed by magnets 41 and 42 into a first composite portion 47 and a second composite portion including magnet portions 35 and 51. Similarly, a theoretical line 46 has been drawn to separate the composite unit formed by magnets 43 and 44 into a first composite portion 48 and a second composite portion including magnet portions 36 and 54. It will be seen that magnet portions 47 and 48 are primarily responsible for suspending and orienting the articles. The magnets 35 and 36 including the second portions 51 and 54 make up another system 34 of magnets which is primarily responsible for other functions as will be explained hereinafter. However, the second composite portions of system 34 are advantageously fabricated out of the same flat stock as are the two magnets 47 and 48 of system 30 so labor is minimized and the design is simplified. Moreover, at least two material joints are avoided; therefore vexatious discontinuities in the magnetic field, known to be caused by material joints, are also avoided.

Although the theoretical lines 45 and 46 are used to explain the two systems of magnets 30 and 34, it is to be understood from the foregoing discussion that there is no discontinuity along such lines 45 and 46 in either the features of the systems or the functions of the magnetic fields produced therein. Such lines are merely drawn at about the area where the articles 12 and 13 enter the slots 84 of transport member 80. Thereafter the articles need not be suspended by system 30; and system 34 therefore acts upon the articles to keep them stabilized in the slots 84 as will later be explained in more detail. Of course, both systems create similar lines of flux in parallel with one another and this unique cooperation between the two systems facilitates transfer of the articles.

The material selected for the magnets shown in FIG. 2 advantageously one having good resistance to demagnetization, e.g., a barium ferrite material. Such ferrite materials are now incorporated either into ceramics or into plastics to produce permanent magnets having high residual magnetication and high magnetizing power per unit of length between the poles. Referring to system 30, the magnets 41, 42, 43 and 44 are provided in the form of flat bars with each entire face of a bar being of substantially the same magnetic polarity. Flat bar magnets of 0.375 to 0.500 inches in thickness are commercially available and the necessary strength of the magnetic field which is desired between the sidewalls 11 and 22 can be obtained by mating such flat bar magnets together as is shown in FIG. 2 to form composites 47 and 48. The magnetic field generated thereby should be of sufficient strength relative to the weight and material of the articles 12 and 13 to suspend them, as shown in FIG. 1, above the floor 24 and between the sidewalls 11 and 22 of the bin 17.

For the preferred example, the distance between the sidewalls 11 and 22 is set at about 3.438 inches which provides an air gap distance "X" between the faces of the magnets 47 and 48 of about 3.563 inches, the difference allowing for the combined thickness of the sidewall sheet materials plus fabrication tolerances. For these conditions a molded plastic, permanent magnet material such as that sold by 3M Company of Minneapolis, Minn. under the trade designation "Plastiform Natsyn PL-1" is selected. Two bars of this material, each about 0.375 inches thick, when mated together provide a composite magnet 47 or 48 which is about 0.750 inches thick. When such magnets 47 and 48 are confronted in the given spaced relationship, a first magnetic field is established transverse to the sidewalls 11 and 22 which is adequate to suspend the aforementioned diodes therebetween in a manner suitable to practice the invention.

A magnetic field produced by the magnets 47 and 48 extends from the inlet end 19 of the bin 17 to the theoretical lines 45 and 46 at about the area where the articles become supported by transport member 80. It has been found, however, that the characteristics of such a magnetic field are not uniform throughout its full extent. An excellent discussion of such characteristics appears in an article entitled "Magnetic Suspension Parts Handling" *The Western Electric Engineer*, July 1967, Vol. XI, No. 3, pp. 36–42, which is hereby incorporated by reference into this application. In the cited article it is pointed out that flux density readings should be taken on a vertical plane which is interposed halfway between confronting magnets to determine whether a field will adequately suspend and orient the supply of articles. In FIG. 2 an abbreviated theoretical vertical plane 49 is shown interposed halfway between magnets 47 and 48 to facilitate explanation of the characteristics of the field established therebetween.

It has been found that the flux density readings, designated by the letter "a", taken at the corners of plane 49 are usually the lowest readings in the field. The readings designated by the letter "b", taken along the indicated perimeter of plane 49, are usually of intermediate value; and the readings designated by the letter "c", taken along the longitudinal line 25, are of the highest value. Moreover, the readings taken along line 25 are generally of a uniform value.

Therefore, elongated magnetic articles which are deposited into the field of system 30 will tend to become suspended along or about line 25. If the system of magnets, and therefore the field, is tilted, the articles will advance under the force of gravity along or about line 25 and tend to congregate at the low end of the line 25. However, such articles will not necessarily leave the field because the flux density value "b" at the end of line 25 is lower than the "c" values. Indeed it is evident that all the values at the boundaries of the field are lower than those values in the internal areas of the field. It, therefore, requires a certain amount of propulsive force upon an article 12 to propel such article out of the areas of "c" value and through the lesser attractive boundary areas having a "b" value of flux density.

In the prior art, a transfer member, such as a thin wheel, has been typically used to pick up the articles in the internal areas of the field and to mechanically transfer such articles through the boundary of the field. However, the rotary section 78 is too wide to be readily disposed within the internal areas of bin 17. It is, therefore, desirable to modify the magnetic conditions at the end 21 of the bin 17 and to concentrate the articles at end 21 in contact with member 80.

The magnetic field created by system 30 comprises lines of flux running between the two confronting faces of magnets 47 and 48. Such lines tend to repel each other because at any incremental section along their length each line is of the same magnetic polarity. Furthermore, the flux prefers to traverse through a magnetically permeable material rather than through an air space and the material used to make the diodes 12 is magnetically permeable. Therefore, when such elongated magnetic articles are suspended in the field the flux enters each article near one pole face and leaves the article at the opposite pole face. Accordingly, the articles take on the same magnetic polarity along their length as the polarity of the flux lines. The result of this phenomena is that the articles tend to repel one another and it is difficult to make them congregate in a dense pattern.

Referring again to FIG. 2, it can be seen that an additional composite magnet 28 has been attached to the near side of magnet 47 and another composite magnet 29 has been attached to the far side of magnet 48. Each magnet 28 or 29 is made up of two flat bar magnets which are mated together to obtain the strength desired. In the preferred example, each flat bar magnet is about 0.250 inches thick, about 0.750 inches wide and about 1.687 inches long. Two such flat bar magnets form a magnet 28 or 29 which is about 0.500 inches in thickness. A suitable combination of materials for such magnets 28 and 29 is a barium-iron oxide material and a ferrite material called "vectolite" incorporated into a ceramic casting. Magnets made of these materials having the desired residual magnetization are sold by Indiana General Company, a Division of Electronic Memories and Magnetics Corporation, Valparaiso, Ind. under the trade designation "Indox 1."

The magnets 28 and 29 generate a second magnetic field in system 30 in a region of the bin 17 which is adjacent to and in contact with the transport member 80. This second magnetic field coincides with and reinforces the first magnetic field in the said region. The reinforced field can best be described with respect to another abbreviated theoretical midplane 50 which is shown in FIG. 2, superimpossed upon midplane 49.

It is believed that the flux denisty value designated by the letter "e" in the center of plane 50 is the highest value on either plane 49 or 50. Also the flux density designated by the letter "d" is believed to be intermediate between a "c" value and the "e" value. Furthermore, observations of article movement indicate that areas designated as "c+" are likely to be higher than a "c" value but not as high as the "d" value or the "e" value.

The effect of the reinforced magnetic field is to cause a supply of articles to congregate in a dense pattern which is adjacent to and in contact with the transport member 80. Furthermore, when the region having the reinforced field is proportioned in accordance with the preferred example, it is found that the articles congregate in a generally circular pattern. It has therefore, been found advantageous to rotate the circular pattern of articles in a counterclockwise direction, typically by moving the articles with a jet of a fluid such as compressed air.

The second magnetic field of system 30 tends to hold the articles together to resist light blows and nudges from the transport member 80 as it advances through part of the pattern. The transport member 80 also rotates in a counterclockwise direction and therefore brings the slots 84 into contact with the rotating pattern so the articles in the pattern can be urged into the slots 84 with a desirable measure of certainty.

The First Level Magnetic Support System

At the feed end 21 of the bin 17 there is shown in FIG. 1, a pair of arcuate members 57 and 58 which are an integral part of a magnetic support system designated generally by the numeral 55. The primary function of system 55 is to facilitate entry of articles 12 into the slots 84 and to stabilize the articles therein. Another function is to prevent more than a predetermined number of articles from entering into the slots 84. For lead straightening purposes the predetermined number of articles such as diodes 12 or 13 is one of such diodes to be entered into each set of opposing slots 84.

Figure 3:
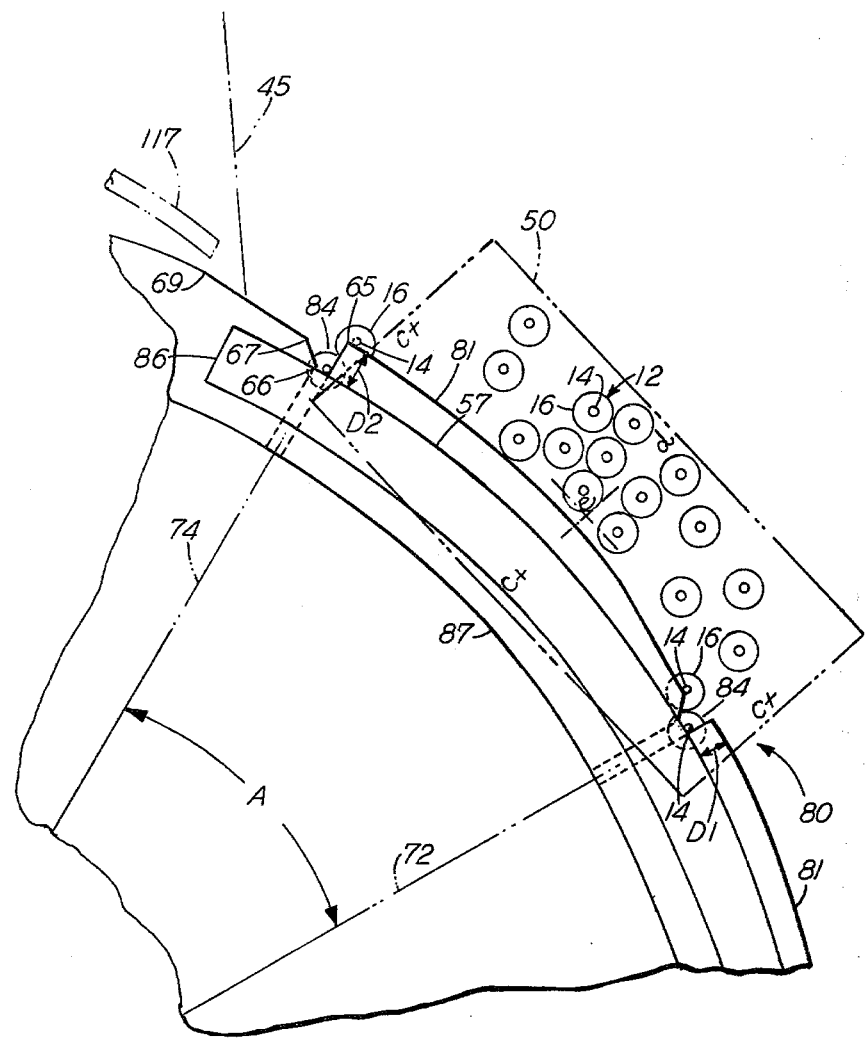
FIG. 3 is a schematical view of an enlarged portion of the rotary section of the machine shown in FIG. 1.

In FIG. 3 there is shown a schematical view of an enlarged portion of the rotary section 78 together with several articles 12 arranged so the articles are urged into contact with transport member 80. The figure shows a subtle aspect of the invention concerning the entry of articles into the slots together with the stabilization of the entered articles and the prevention of double article retention in the slots 84. Only one side of the transport member 80 is shown and discussed although it will be appreciated that the other side has similar features to those shown which cooperate upon the same articles at the same time as do the features on the side shown.

A portion of the guide disc 81 is shown containing a slot 84 at the area where the diodes 12 are picked up and one of such diodes 12 enters into slot 84. Note that the guide disc 81 is contoured and chamfered at the leading edge of the slots 84 to facilitate pickup of the diodes 12 by the Graule head. The contour starts at a point 69 which is about 0.500 inches away from a radially drawn centerline running through each slot 84. The contour continues for about 0.400 inches to a point 67 and from point 67 a chamfer cut is shown on a line running at about 45 degrees with the slot centerline, ending at a point 66. On the trailing edge of each slot 84 a square cut corner 65 is provided to retain the leads 14 of the diodes 12.

To show the relationship of the orienting magnetic field to the pickup of the diodes 12 by the slots 84, the theoretical line 45 of FIG. 2 is also shown in the background in FIG. 3. Also, the theoretical midplane 50 is shown together with flux intensity indications to show the cooperation between the reinforced magnetic field of system 30 and the operation of rotary section 78.

A limiting support member 57 is disposed adjacent to guide disc 81 in such a manner that the member 57 can act upon a lead 14 of each diode 12 as close to its body 16 as is practical. A sector of the rotary section 78 is shown between a radial line 72 and another radial line 74 which sector is designated by a central angle "A", equal to about 30 degrees. Note that when lines 72 and 74 are projected radially outward the sector "A" includes much of the region 50 having the reinforced magnetic field. Note also that, as the slots 84 are advanced counterclockwise, they pass through the area having the highest flux intensity in the magnetic field designated by the letter "e".

Referring again to the limiting support 57, it can be seen that an entered article is supported at a first level at a point where the radial line 72 intersects the surface of support member 57. This is the area where a slot 84 has the first practical opportunity to pick up a diode 12. The position of the support member 57 with respect to the periphery of the guide disc 81 functions to limit the effective depth of the slot 84.

For the preferred example, an effective slot depth D-1 is advantageously limited to from about 0.090 to about 0.095 inches. Note that such limited depth D-1 permits a first diode 12 to completely enter the slot 84 and permits a second diode 12 to be advantageously caught upon the first fully entered diode 12. Catching a second diode 12 upon a fully entered first diode 12 has been found to be desirable because pressure is exerted thereby upon the entered first diode to enhance its stability in slots 84 at the first level. As the entered first diode 12 is rotated through a dense pattern of suspended diodes 12 and 13, such suspended diodes exert dislodging forces upon the caught second diode 12 and such second diode offers a good measure of protection for the entered first diode 12.

The limiting support member 57 gradually tapers from the point where line 72 intersects the limiting member 57 at the pickup area to a slightly lower level where the other radial line 74 intersects member 57. Therefore, as the guide disc 81 continues to rotate, the entered first diode 12 is lowered deeper into the slot 84 and the caught second diode 12 lowers also, causing it to roll, under the influence of the magnetic field, in a clockwise direction about the entered diode 12. At the radial line 74, the entered diode 12 has descended to a depth D-2 of from about 0.105 to about 0.115 inches below the top of guide disc 81. Also, at radial line 74, the caught second diode 12 comes under pressure from at least one stream of air from either of jets 117 or 118 (FIG. 1), located on section 115. Such streams are directed approximately tangentially at about the area where radial line 74 intersects the periphery of the guide line 81. The caught diode 12 is then rolled off the entered first diode 12 by the air stream and it falls back into the bin 17 while the entered first diode 12 continues to advance.

The effective slot depths D-1 and D-2 have been found to be advantageous for pickup, temporary stabilization and roll off of the diode 12 in the preferred example. Furthermore, the range of such depths D-1 and D-2 have been found to be somewhat critical for optimum operation under the conditions described. If the depth D-1 is too shallow the entered first diode may not be properly retained by the slot 84. If the depth D-1 is greater than 0.095 inches, then the second diode 12 may not be caught well enough upon the entered first diode to withstand the dislodging forces exerted by the diodes 12 in the supply as the first and second diodes are advanced. If the depth D-1 is greater than 0.120, then the second diode may enter deep enough to have its lead 14 retained on edge 65 and double retention may occur.

At about the position where the caught second diode 12 is rolled off by the air from jets 117 and 118, the depth D-2 is also found to be somewhat critical for optimum operation under the conditions described. If the depth D-2 is too great, e.g., over 0.120 inches, a lead 14 of a caught second diode 12 may be retained in the slot 84 and double retention may occur. On the other hand, if the depth D-2 is too shallow the caught second diode may remain lodged against the prior entered, first diode 12 and the air streams may not be effective to remove the caught second diode 12. In either case double retention may occur under the conditions described for the preferred example.

Because of the importance of the particular depths at pickup and roll off of the diodes 12, it will be appreciated that the positions of the limiting members 57 and 58 (not shown in FIG. 3) are carefully set to suit the dimensions of an article 12. It will be appreciated, however, that a lead 14 of an article 13 will often be bent or curved away from a body 16. Therefore, the most reliable position of such article 13 may be ascertained by supporting the article on the leads 14 as close to the body 16 as is feasible. It is, therefore, desirable to locate the members 57 and 58 close to the guide discs 81 and 82 to keep the supporting edge as thin as structural considerations will permit.

Figure 4:
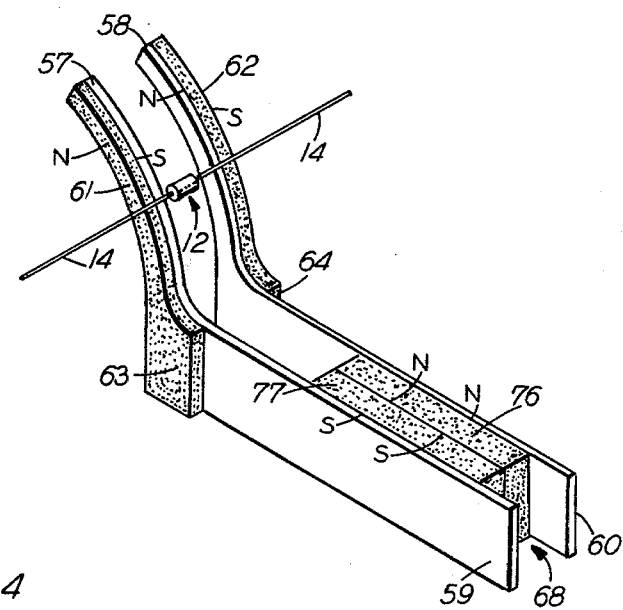
FIG. 4 is a pictorial view of a magnetic support system from the machine shown in FIG. 1 for attracting and stabilizing articles in slots at a first level in accordance with the instant invention.

Referring now to FIG. 4, there is a pictorial view showing in more detail the magnetic support system 55 referred to hereinabove with respect to FIG. 1. The system 55 comprises the arcuately shaped, limiting support member 57 located immediately adjacent to the guide disc 81 and another similar but opposite hand member 58 located immediately adjacent to the outer side of the guide disc 82. From the above discussion with respect to FIG. 3, it will be appreciated that such limiting member, without additional means, are sufficient to limit the number of articles which can enter the slots 84 on a transport member 80.

However, for high speed production, for high efficiency and for the varied conditions found when handling axially leaded articles, it has been found advantageous to employ a magnetic field to attract the articles into the slots and to enhance the limiting function. On the other hand, there is little available space for magnets between the member 57 and the bin floor portion 31 and also between the member 58 and the bin floor portion 32, shown in FIG. 1. Therefore, a composite magnetic system having a remote reinforcing magnet is advantageously applied in system 55 as is shown in detail in FIG. 4.

Attached to the lower ends of member 57 and 58 there are shown extension members 59 and 60, respectively, which protrude away from the rotary section 78.

Each limiting member and its extension are advantageously formed from a magnetically permeable material such as cold rolled steel. Moreover, each member and its extension are integrally formed from the same piece of steel flat stock to avoid discontinuities and concordant impedance to magnetic flux.

Along the outer sides of the limiting members 57 and 58 there are attached two arcuately formed magnets 61 and 62 ending in two enlarged portions 63 and 64, respectively, at the lower areas. Between the extensions 59 and 60 there is a large composite magnet 68 comprised of two smaller magnets 76 and 77.

For the preferred example, the magnets 61 and 62 and the wide portions 63 and 64 are formed from about 0.125 inches thick, flat bar magnet material such as the aforementioned "Plastiform Natsyn PL-1." The composite reinforcing magnet is formed by mating two magnets 76 and 77 together, each being about 0.280 inches thick, about 0.750 inches wide and about 1.750 inches long. An appropriate material for the two ceramic magnets 76 and 77 is the aforementioned "Indox 1." In all of the magnets of system 55, the entire broad face of each magnet is of substantially the same polarity and the thickness of the magnet material is the distance between the poles of each magnet.

The magnets of system 55 provide a relatively strong force field having lines of flux which communicate substantially between members 57 and 58 and, therefore, transversely of the transport member 80. The magnets 61 and 62 establish a field between each other by virtue of the permanent residual magnetization present in each such magnet 61 and 62. However, this field is significantly reinforced by the magnet 68 located between the extension members 59 and 60. By this arrangement, each limiting member, including its extension, becomes a north or a south pole piece. The flux from the transverse field is conducted mainly through one of the extended limiting members to the reinforcing magnet 68 and the flux is then returned mainly through the other extended limiting member to the said transverse magnetic field.

The components of the magnetic system 55 advantageously are of sufficient strength relative to the weight and material of the articles 12 and to any dislodging forces generated by the conditions under which the articles are transported to stabilize such articles at the first level. The air gap between members 57 and 58 is about 0.562 inches for the preferred example. The bodies 16 of the diodes 12 are suspended in the air gap with the leads 14 resting on the limiting member pole pieces of the magnetic system 55. The flux preferentially seeks the magnetically permeable leads 14 of a diode 12 and flows through the body 16 to the opposite pole thus providing excellent attractive stability for the diode which has entered a pair of slots 84. The reinforced field of system 55 is seen to significantly enhance the limiting function because it stabilizes an entered first diode 12 and partially stabilizes a caught second diode thereupon. Furthermore, the force of system 55 is easily varied to suit different articles and different transport conditions by varying the size or material of the reinforcing magnet 68. Of course, the force desired in system 55 will depend also on the available attraction and stability provided by other magnetic fields because of the close cooperation therebetween.

The First and Second Level Radial Magnetic Field

Referring again to FIG. 1, there is seen at the outlet end 21 of the bin 17, another system of magnets designated generally by the numeral 70. Such system 70 is seen more clearly in a pictorial view of its components shown in FIG. 5. A major component of system 70 is an arcuately shaped member 71 which is supported by the floor 23 of bin 17 and such member 71 extends between guide discs 81 and 82 to a point between the stationary shoes 101 and 102 where the articles are engaged for straightening.

System 70 functions primarily to attract the bodies 16 of articles 12 to the first and then to the second levels. A strip magnet 73 is affixed to the arcuate portion of a member 71 along a distance approximately equal to the distance along transport member 80 at which the entered articles are at the first level; and a series of pin magnets 75 are provided beyond magnet 73 to the end of member 71.

Figure 5:
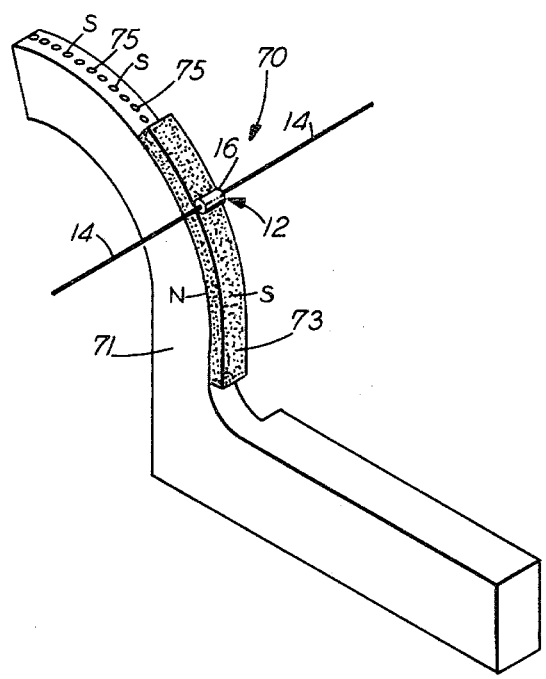
FIG. 5 is a pictorial view of a system of magnets from the machine shown in FIG. 1 for attracting the bodies of articles at a first level and at a second level in accordance with the instant invention.

It will be seen from FIG. 5 that the strip magnet 73 presents an extensive outward face which is substantially all of the same polarity. In the preferred example, the south pole face is presented outward and the north pole face is presented inward toward the shaft 96 of rotary section 78. Similarly, the pin magnets 75 which are set at the second level are oriented with their south pole faces presented outward. It is thus seen that the lines of flux which are generated by the magnets extend in a substantially radial direction inward of the slots 84.

The strip magnet 73 is about 0.125 inches thick, about 0.313 inches wide and extends for approximately the full length of the first level. A suitable material for the magnet 73 in the preferred example is the aforementioned "Plastiform Natsyn PL-1." The pin magnets are about 0.125 inches in diameter, about 0.625 inches deep and are spaced about 0.230 inches on center. A suitable selection for the magnets 75 in the preferred example is a combination of aluminum, nickel and cobalt, designated as Alnico 5 or 8 material sold by the aforementioned Indiana General Company in the form of centerless ground, cylindrical shapes, cut to the desired length.

It can be appreciated by comparing FIG. 4 with FIG. 5 that there is a close cooperation between the magnetic support system 55 and the system of magnets 70, at the first level. System 70 attracts the body portions of the articles to the first level. The polar face of the magnet 73, having a high concentration of flux, is presented very close to the body 16 of an entered diode 12. Moreover, the flux generated by system 55 runs transverse to the guide discs 81 and 82, thereby temporarily magnetizing each article and making such article more readily attracted by system 70.

After the articles are advanced beyond sector "A" in FIG. 3, the first level support is discontinued, in effect it is removed, and the articles enter slots 84 to a second, deeper level. Thereafter the magnetic effect of the limiting member pole pieces 57 and 58 is not available to stabilize the articles. However, in the preferred example there are thirteen of the pin magnets 75 available, which also present south pole faces to the bodies 16 of articles 12. There are thus presented a series of radially directed magnetic fields generated by the magnets 75 which radially attract the articles inward of the slots 84 as the articles are advanced to the straightening shoes.

The First and Second Level Transverse Magnetic Field

Figure 6:
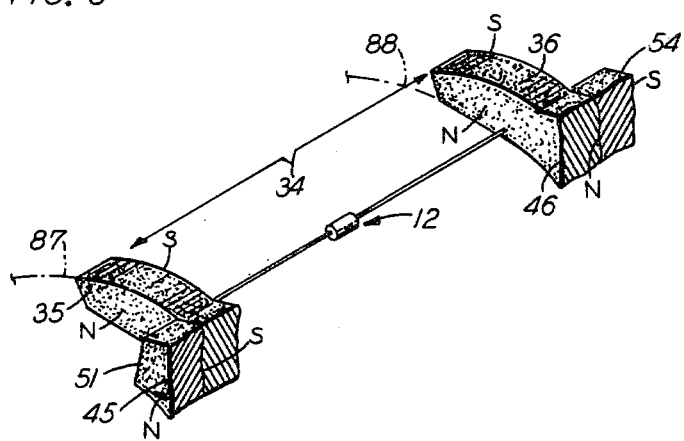
FIG. 6 is a pictorial view of a system of magnets from the machine shown in FIG. 1 for attracting and stabilizing articles in slots at a first level and a second level in accordance with the instant invention.

Referring again to FIG. 1, there is seen at the outlet end 21 of bin 17, a system of magnets designated generally by the numeral 34, such system also being shown in more detail in FIG. 2. FIG. 6 is a pictorial view, showing the system of magnets 34 in still more detail and from a different viewpoint. Note that the major arcuate magnet 35 is disposed along part of the outside edge of rotary member 87 and the other major arcuate magnet 36 is disposed along part of the outside edge of rotary member 88. Both magnets 35 and 36 have somewhat enlarged sections near the theoretical lines 45 and 46, respectively, which are repeated from FIG. 2. These enlarged sections result from the practical way the magnets 35 and 36 were formed from the same flat stock as were magnets 42 and 43 of system 30. Also magnet portions 51 and 54 are similarly structured, being a result of the fabrication of magnets 41 and 44 from the same flat stock.

In the preferred example, magnets 35 and 36 are about 0.375 inches thick, measured transversely of the rotary section 78 and the arcuate portions are from about 0.360 inches to about 0.400 inches deep, measured radially of section 78. Both the portions 51 and 54 are about 1.125 inches deep along lines 45 and 46, respectively. The system 34 magnets are suitably made from the aforementioned material, "Plastiform Natsyn PL-1."

The system 34 functions primarily to stabilize the articles 12 without discontinuity, after they leave the suspending and orienting field of system 30. Once picked up by the transport member 80 the articles are no longer suspended by system 30, and the flux characteristics of the magnetic field as measured on a midplane are less useful for explaining the influence of the magnets upon the articles. However, it has been indicated in the article "Magnetic Suspension Parts Handling," cited previously, that magnets having broad, substantially uniform polar faces generate the highest flux densities in the corner and border areas when such densities are read just adjacent to the faces of the magnets. The opposing leads 14 of articles 12 in system 34 are advanced along and adjacent to the magnets 35 and 36. It is believed that the flux generated by system 34 and particularly by the lower border areas of the magnets 35 and 36 enters the leads 14 of the articles 12 and thus communicates, from end to end of the articles, transversely of the rotary section 78.

Note the close cooperation of system 34 with the other systems of magnets. System 30 suspends and orients the articles 12 and urges them into the field of system 34 without discontinuity of lines of force. At pickup of the articles, the transverse field of system 34 is selectively reinforced in the area of the limiting members by the transverse field of system 55. Flux from both systems enters the leads 14 and the bodies 16 of the articles 12. Also at pickup of the articles, the radial field of system 70 attracts the bodies 16, which attraction is enhanced because both system 34 and system 55 temporarily magnetizes the articles 12. Then as the articles 12 are advanced by transport member 80, the influence of system 55 is removed and the strong influence of the pin magnets 75 tends to attract the articles to the second level. Of course, such influence of the series of inwardly directed fields generated by the pin magnets 75 is enhanced because system 34 continues to temporarily magnetize the articles 12 until they reach the straightening shoes 101 and 102. The articles are thus more readily attracted by the pin magnets 75 to stabilize such articles at the second level.

The Air and Brush Section

Figure 7:
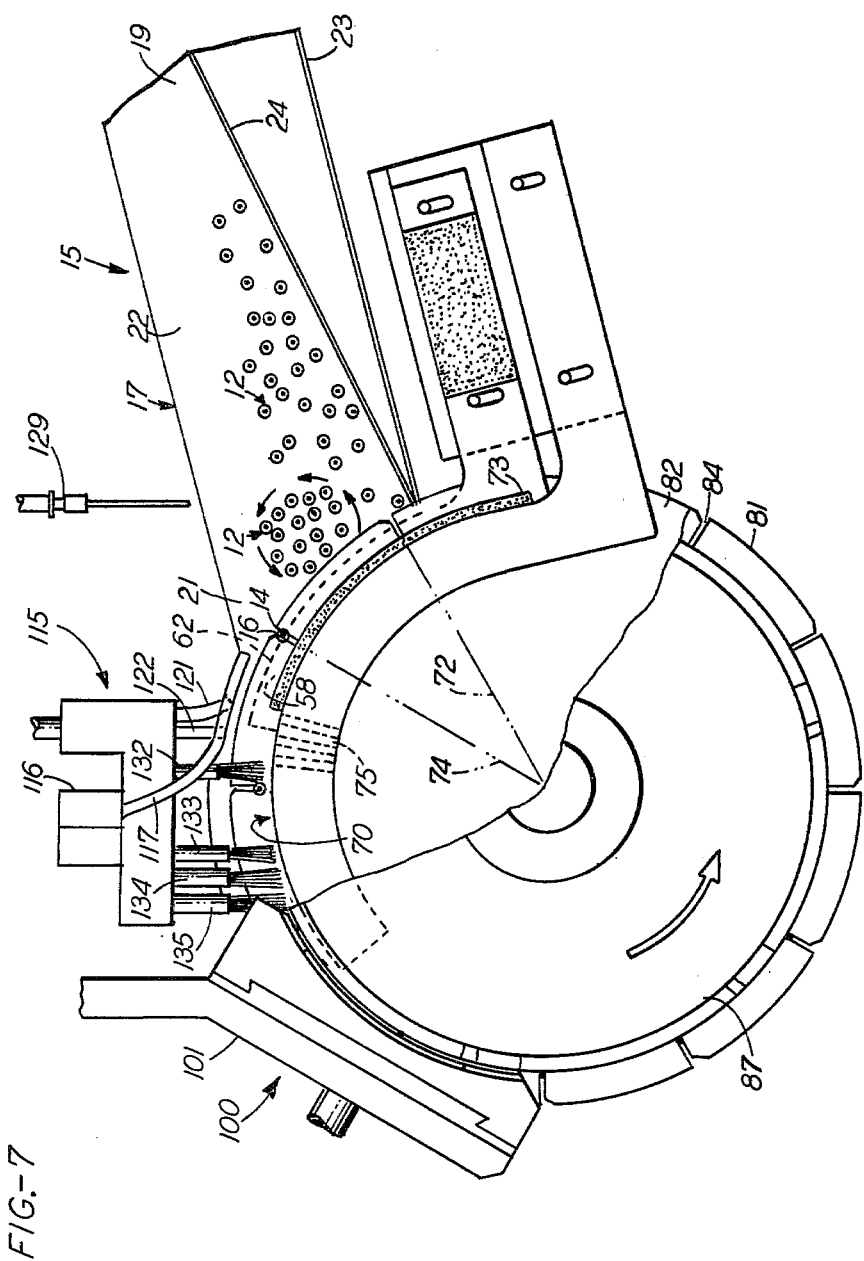
FIG. 7 is a partially cross-sectional view of an assembled straightening machine such as that shown in FIG. 1 taken on a central plane passing between the guide discs.

Referring now to FIG. 7, there is shown a partially cross-sectional view of an assembled straightening machine such as that shown in FIG. 1, the view being taken along a central plane passing between the guide discs 81 and 82. Referring also to FIG. 1, there is shown above the rotary section 78, an air and brush section designated generally by the numeral 115. A manifold 116 is shown extending axially of the rotary section 78 and a member 126 is shown extending transversely of the manifold 116 in a central area above the guide discs 81 and 82. The member 126 contains a manifold 127 which distributes a fluid such as, for example, compressed air, to a pair of radially directed air jets 121 and 122. The manifold 116 also distributes a similar fluid such as, for example, compressed air, to two air jets 117 and 118 which straddle the guide disc 81 and to two air jets 119 and 120 which straddle the guide disc 82. The four said jets are directed tangentially of the transport member 80 at about the area where the articles are advanced out of the pattern in the bin 17. Also, the member 126 supports four sets of brushes 132, 133, 134 and 135 each of which depend vertically for different distances to contact the bodies of articles 12 transported by member 80.

There are at least five functions which are seen to be performed by the air and brush section 115. The tangentially directed jets 117, 118, 119 and 120 operate in cooperation with the reinforced magnetic field of system 70 to remove caught second diodes 12 to prevent double retention of diodes which may be advanced to the straightening shoes 101 and 102. Also the same tangentially directed jets cooperate with an overhead air jet 129, shown in FIG. 7, to rotate the dense pattern of articles 12 and 13 to bring the articles into proper contact with the transport member 80.

The radially directed air jets 121 and 122 cooperate with the limiting members 57 and 58 and the pin magnets 75 to move the entered articles to the second level. The sets of brushes 132, 133, 134 and 135 cooperate with the pin magnets 75 to hold the articles 12 at the second level. Moreover, the sets of brushes 133, 134 and 135, in particular, cooperate in multiple element fashion and may be seen to impart a beneficial clockwise spin to the articles prior to their engagement between the rotary members 87 and 88 and the shoes 101 and 102, respectively. It is believed that such spinning of the articles may provide a partial straightening of bent leads 14 of an article 13.

Operation

The operation of the invention will be explained by reference to FIG. 1 and FIG. 7 using the parameters of the preferred example. The diodes 12 and 13 are fed into the inlet end 19 of the bin 17 from a source (not shown). The system of magnets 30 suspends and orients the diodes so their elongated dimensions are transverse to the given direction in which the diodes are to be transported. The feed section 15 is pitched toward the rotary section 78 so the diodes tend to follow along midline 25 and to congregate near the outlet end 21 of the bin 17.

In the region 50 of reinforced magnetic influence, a dense, circular pattern of diodes tends to form. The dense pattern of diodes is advantageously pressed forward by the mass of less densely arranged diodes suspended throughout the bin 17. The sloped floor of the bin 17 minimizes the number of less densely arranged diodes required to keep the dense pattern in contact with the transport member 80. It has been found, that for peak efficiencies, the bin should contain a minimum supply of from about 60 to about 80 of the diodes 12 or 13. Otherwise, the pressure of the diodes on the rear of the pattern tends to be less than ideal to urge the diodes into contact with the transport member 80.

In operating at a desired throughput of from about 45,000 to about 48,000 diodes per hour, the transport member 80 rotates counterclockwise at about 70 R.P.M. and delivers about 800 diodes per minute for straightening. In practice of the invention, typical efficiencies of between 90 and 98% have been experienced, depending on the condition of the diodes in the supply. For example, some diodes 12 have bodies 16 containing plastic flashing, some diodes 12 or 13 are stuck together and other diodes 12 have only one lead 14. All such diodes have a deleterious effect on the efficiency of lead straightening.

The stream of air from jet 129 helps to keep the pattern in place and the multiple streams of air from jets 117, 118, 119 and 120 tend to rotate the pattern into contact with the transport member 80. The diodes 12 or 13 enter into pairs of opposing slots 84 on the guide discs 81 and 82 at the pickup area, located between radial lines 72 and 74, as the transport member 80 rotates in a counterclockwise direction. When second diodes are caught onto entered first diodes, the caught second diodes tend to rotate about the entered first diodes under the influence of the reinforced magnetic field in the region 50 of system 30 and are further urged back into the supply of diodes by the air streams issuing from air jets 117, 118, 119 and 120. The diodes supported by the transport member 80 come under the influence of the two transverse magnetic fields of systems 34 and 55 and the radial magnetic field of system 70 at the first level. At a short distance beyond the roll-off area, located at about radial line 74 in FIG. 3, the limiting members 57 and 58 terminate at line 86, allowing the diodes to enter the slots 84 to the second level. The pin magnets 75 tend to pull the body portions 16 inward and the radial jets 121 and 122 impinge air streams upon the same body portions 16 to assist the magnets 75 in moving the entered diodes to the second level. Coincidentally therewith, the magnetic system 34 attracts the leads 14 of the diodes 12 toward the lower, high flux density, border areas of magnets 35 and 36. Also the flux of system 34 is conducted transversely of the rotary section 78 by the diodes 12, temporarily magnetizing such diodes and making them more attractive to the pin magnets 75.

Once lowered to the second level the diodes pass under the first set of brushes 132 at about the top of the transport member 80 and the brushes retain the diodes at the second level. Thereafter the sets of brushes 133, 134 and 135 continue to retain the diodes at the second level and the multiple elements of such brushes impart a spin to the diodes prior to their entry between the lead engaging members. Once through the straightening cycle the diodes 12 are removed from the machine by conventional deflecting means or other ejection means (not shown).

While the detailed description has been directed primarily to lead straightening of axially leaded devices, it is to be understood that the invention is by no means restricted to lead straightening or to such devices. The advantages gained by transferring elongated magnetic articles directly from magnetic bins onto deep slotted transport members are available for other types of treatment operations. Moreover, the method and means of transporting and stabilizing the articles on a transport member are also available whether or not a magnetic bin is used in transferring the articles. Furthermore, a transport member need not advance in a circular direction in the practice of the invention; for example, the transport member could be a chain track having a succession of opposing slots and the track could advance linearly or arcuately to suit the requirements of a treating operation.

There have been illustrated herein certain practical embodiments of the invention and certain applications thereof. Nevertheless, it is to be understood that various modifications and refinements may be made and used which differ from these disclosed embodiments without departing from the spirit and scope of the instant invention.

What is claimed is:

1. A method of transferring and transporting elongated, magnetic articles, comprising:
   orienting a supply of the articles so the elongated dimension of each article is substantially transverse to a given direction in which said articles are to be transported;
   urging the articles into contact with a transport member, said member having a succession of slots adapted to receive the articles;
   advancing the transport member in the given direction in communication with the supply of articles to permit the articles to be urged into the successive slots in the member;
   magnetically attracting the articles into the slots and supporting the articles in the slots along a fixed first level support sufficiently to stabilize such articles therealong and to prevent more than a predetermined number of articles from entering each of the slots;
   magnetically attracting the entered articles as such articles are advanced by the transport member beyond the supply of the articles; and
   discontinuing supporting the articles at the first level after the articles are so advanced beyond the supply and magnetically attracting the entered articles further into the slots to a predetermined second level.

2. The method of claim 1, wherein the orienting step further comprises:
   placing the articles between spaced sidewalls of a bin;
   establishing between and transverse to said sidewalls a first magnetic field of sufficient strength relative to the weight and material of said articles to orient and to suspend the articles between the sidewalls; and
   establishing between and transverse to said sidewalls of the bin a second magnetic field in a localized region adjacent to the transport member, the flux of the second magnetic field coinciding with and reinforcing the first magnetic field substantially in the said region sufficiently and in such a manner as to cause at least a portion of the articles in the supply to congregate in a dense pattern adjacent to the transport member.

3. The method of claim 2, wherein the urging step further comprises:

pressing the dense pattern of articles against the advancing transport member with sufficient force relative to the conditions under which the transport member is advanced to yieldingly resist displacement of articles away from the pattern; and rotating the dense pattern of articles.

4. The method of claim 3, wherein the magnetically attracting and supporting step further comprises:
limiting the depth to which the articles can enter the slots on the transport member by positioning one of a pair of stationary magnetic members adjacent to either side of the transport member at the peripheral portion of the transport member where the articles enter the slots to the first level; and
establishing a magnetic field transverse to the pair of limiting members at the first level, which field is of sufficient strength relative to the weight and material of the articles and the conditions at the slots to cause the entered articles to become stabilized in the slots.

5. The method of claim 4, further comprising:
reinforcing the said magnetic field at the limiting members to a sufficient strength relative to the weight and material of the articles and to any dislodging forces generated by the conditions under which the articles are transported to stabilize the articles in the slots at the first level.

6. The method of claim 4, further comprising:
establishing a stationary magnetic field at the peripheral portion of the transport member in the area of the limiting members, the said field providing lines of force directed substantially inward of the slots to attract the articles to the first level; and
establishing at least one stationary magnetic field at the peripheral portion of the transport member extending from the limiting members forward to an area where the articles may be treated, said magnetic field providing lines of force directed substantially inward of the slots to attract the entered articles to the second level.

7. The method of claim 4, wherein the slots are sufficiently deep to receive more than a singular article therein and wherein the predetermined number of articles permitted to enter each slot is one of such articles, further comprising:
positioning the limiting member, in the area where the articles enter the slots, so the slots are deep enough to fully retain an entered first article while permitting a second article to be temporarily caught upon the first article, the slots being insufficiently deep to permit the caught second article to move over the first article and thereby to be removed as the transport member advances in communication with the supply of articles and the slots being insufficiently deep to fully retain the caught second article in the slots by deep penetration therein; and
tapering the limiting members downwardly in the direction in which the articles are advanced such that an entered first article is gradually lowered sufficiently to permit a caught second article to move off the first article as the transport member advances beyond the supply of articles, the entered first article being lowered insufficiently to fully retain the caught second article in the slots by deep penetration therein.

8. The method of claim 4, further comprising:
directing at least one stream of fluid about the slots after the entered articles are advanced beyond the supply of articles such that any articles caught upon said entered articles are then removed from the transport member.

9. The method of claim 4, further comprising:
directing at least one stream of fluid upon the articles in the slots to move such articles to the second level.

10. The method of claim 4, further comprising:
establishing at the peripheral portion of the transport member, a stationary magnetic field transverse to such member and extending from the supply of articles to an area where the articles are to be treated, which magnetic field is at least as extensive as the articles are long and said magnetic field being of sufficient strength relative to the weight and material of the articles and to any dislodging forces generated by the conditions under which the articles are transported to stabilize the articles in the slots.

11. The method of claim 4, further comprising:
brushing the articles, after they reach the second level and as they are further advanced, to retain the articles in the slots at the said second level and to impart a spin to the articles.

12. The method of claim 4 wherein the elongated magnetic articles have a body with opposing leads extending therefrom and wherein the urging and advancing steps further comprise:
urging the articles into contact with a pair of guide discs, said discs being spaced apart sufficiently to accommodate the body of an article therebetween, the discs having successive pairs of opposed slots on the perimeters thereof to permit opposing leads of an article to enter therein and to permit the body of such article to be suspended therebetween, said slots being sufficiently deep to receive more than a singular article therein;
rotating the pair of guide discs in communication with the supply of articles to permit the leads of such articles to be urged into the successive pairs of opposed slots on the perimeters of the discs, the articles being thereby transported in a circular direction; and
engaging the leads of the articles between a pair of rotary members and a complementary pair of stationary members, one of such rotary members being disposed on either side of the pair of guide discs, each rotary member having formed peripherally thereon successively connected, raised surfaces tapering such that leading, narrow ends of the surfaces are disposed adjacent to the bodies of the articles and the trailing ends of such surfaces being sufficiently wide to accommodate the full length of a lead of an article, and each stationary member having a raised surface tapering such that narrow ends are first to engage with the leading, narrow ends of the rotary surfaces on leads adjacent to the bodies of the articles and wider ends thereafter engage with the trailing, wide ends of the rotary surfaces upon the leads in a complementary manner, each of the pair of said stationary members yieldingly cooperating with each of the pair of rotary members upon an opposing lead of an article to simultaneously roll both leads of an article progressively away from the body of the article to straighten such leads.

13. Apparatus for transferring and transporting elongated, magnetic articles, comprising:
- means for orienting a supply of the articles so the elongated dimension of each article is substantially transverse to a given direction in which said articles are to be transported;
- means for urging the articles into contact with a transport member, said member having a succession of slots adapted to receive the articles;
- means for advancing the transport member in the given direction in communication with the supply of articles to permit the articles to be urged into the successive slots in the member;
- means for magnetically attracting the articles into the slots and supporting the articles in the slots along a first level support sufficient to stabilize such articles therealong and to prevent more than a predetermined number of articles from entering each of the slots;
- means for magnetically attracting the entered articles as such articles are advanced by the transport member beyond the supply of the articles; and
- means for discontinuing supporting the articles at the first level after the articles are so advanced beyond the supply and for magnetically attracting the entered articles further into the slots to a predetermined second level.

14. The apparatus of claim 13, wherein the orienting means further comprises:
- a bin including spaced sidewalls;
- means for establishing between and transverse to said sidewalls a first magnetic field of sufficient strength relative to the weight and material of said articles to orient and to suspend the articles between the sidewalls; and
- means for establishing between and transverse to said sidewalls of the bin a second magnetic field in a localized region adjacent to the transport member, the flux of the second magnetic field substantially coinciding with and reinforcing the first magnetic field in the said region sufficiently and in such a manner as to cause at least a portion of the articles in the supply to congregate in a dense pattern adjacent to the transport member.

15. The apparatus of claim 14, wherein the urging means further comprises:
- means for pressing the dense pattern of articles against the advancing transport member with sufficient force relative to the conditions under which the transport member is advanced to yieldingly resist displacement of articles away from the pattern; and
- means for rotating the dense pattern of articles.

16. The apparatus of claim 15, wherein the magnetically attracting and supporting means further comprises:
- a pair of stationary magnetic members for limiting the depth to which the articles can enter the slots on the transport member, one of such pair of members being positioned adjacent to either side of the transport member at the peripheral portion of the transport member where the articles enter the slots to the first level; and
- means for establishing a magnetic field transverse to the pair of limiting members at the first level, which field is of sufficient strength relative to the weight and material of the articles and the conditions at the slots to cause the entered articles to become stabilized in the slots.

17. The apparatus of claim 16, further comprising:
- means for reinforcing the said magnetic field established at the limiting members including extending the limiting members and attaching a reinforcing magnet between such extensions, the said reinforcing magnet being sufficiently strong and the limiting members being sufficiently magnetically permeable as to conduct flux from the transverse magnetic field mainly through one of the extended limiting members to the reinforcing magnet and to return said flux mainly through the other extended limiting member to the transverse magnetic field such that the said transverse magnetic field is reinforced to a sufficient strength relative to the weight and material of the articles and to any dislodging forces generated by the conditions under which the articles are transported to stabilize the articles in the slots at the first level.

18. The apparatus of claim 16, further comprising:
- means for establishing a stationary magnetic field at the peripheral portion of the transport member in the area of the limiting members, the said field providing lines of force directed substantially inward of the slots to attract the articles to the first level; and
- means for establishing at least one stationary magnetic field at the peripheral portion of the transport member extending from the limiting members forward to an area where the articles may be treated, said magnetic field providing lines of force directed substantially inward of the slots to attract the entered articles to the second level.

19. The apparatus of claim 16, wherein the slots are sufficiently deep to receive more than a singular article therein and wherein the predetermined number of articles permitted to enter each slot is one of such articles, further comprising:
- means for positioning the limiting members, in the area where the articles enter the slots, so the slots are deep enough to fully retain an entered first article while permitting a second article to be temporarily caught upon the first article, the slots being insufficiently deep to permit the caught second article to move over the first article and thereby to be removed as the transport member advances in communication with the supply of articles and the slots being insufficiently deep to fully retain the caught second article in the slots by deep penetration therein; and
- means for tapering the limiting members downwardly in the direction in which the articles are advanced such that an entered first article is gradually lowered sufficiently to permit a caught second article to move off the first article as the transport member advances beyond the supply of articles, the entered first article being lowered insufficiently to fully retain the caught second article in the slots by deep penetration therein.

20. The apparatus of claim 16, further comprising:
- means for directing at least one stream of fluid about the slots after the entered articles are advanced beyond the supply of articles such that any articles caught upon said entered articles are then removed from the transport member.

21. The apparatus of claim 16, further comprising:

means for directing at least one stream of fluid upon the articles in the slots to move such articles to the second level.

22. The apparatus of claim 16, further comprising:
means for establishing at the peripheral portion of the transport member, a stationary magnetic field transverse to such member and extending from the supply of articles to an area where the articles are to be treated, which magnetic field is at least as extensive as the articles are long and said magnetic field being of sufficient strength relative to the weight and material of the articles and to any dislodging forces generated by the conditions under which the articles are transported to stabilize the articles in the slots.

23. The apparatus of claim 16, further comprising:
means for brushing the articles, after they reach the second level and as they are further advanced, to retain the articles in the slots at the said second level and to impart a spin to the articles.

24. The apparatus of claim 17, wherein the elongated magnetic articles have a body with opposing leads extending therefrom and wherein the urging and advancing means further comprise:
a pair of guide discs, spaced apart sufficiently to accommodate the body of an article therebetween, the discs having successive pairs of opposed slots on the perimeters thereof to permit opposing leads of an article to enter therein and to permit the body of such article to be suspended therebetween, said slots being sufficiently deep to receive more than a singular article therein;

means for rotating the pair of guide discs in communication with the supply of articles to permit the leads of such articles to be urged into the successive pairs of opposed slots on the perimeters of the discs, the articles being thereby transported in a circular direction; and means for engaging the leads of the articles between a pair of rotary members and a complementary pair of stationary members, one of such rotary members being disposed on either side of the pair of guide discs, each rotary member having formed peripherally thereon successively connected, raised surfaces tapering such that leading, narrow ends of the surfaces are disposed adjacent to the bodies of the articles and the trailing ends of such surfaces being sufficiently wide to accommodate the full length of a lead of an article, and each stationary member having a raised surface tapering such that narrow ends are first to engage with the leading, narrow ends of the rotary surfaces on leads adjacent to the bodies of the articles and wider ends thereafter engage with the trailing wide ends of the rotary surfaces upon the leads in a complementary manner, each of the pair of said stationary members yielding cooperating with each of the pair of rotary members upon an opposing lead of an article to simultaneously roll both leads of an article progressively away from the body of the article to straighten such leads.

* * * * *

UNITED STATES PATENT AND TRADEMARK OFFICE
CERTIFICATE OF CORRECTION

PATENT NO. : 4,282,908

DATED : August 11, 1981

INVENTOR(S) : K. E. Bankes-A. F. Johnson, Jr.-D. M. Large-F. J. Reinhard

It is certified that error appears in the above-identified patent and that said Letters Patent are hereby corrected as shown below:

Column 8, line 9, after "2" insert --is--.

Column 10, line 4, "superimpossed" should be --superimposed--.

Column 11, line 65, "line" should be --disc--.

Column 12, line 39, after "82" insert --and--.

Column 12, line 51, "member" should be --members--.

Column 12, line 66, "member" should be --members--.

Column 14, line 16, after "of" delete --a--.

Column 18, line 61, Claim 2, after "field" insert --substantially--.

Column 18, line 62, Claim 2, after "field" delete --substantially--.

Column 21, line 16, Claim 13, "sufficient" should be --sufficiently--.

Column 23, line 22, Claim 24, "Claim 17" should be --Claim 16--.

Signed and Sealed this

Twenty-seventh Day of October 1981

[SEAL]

Attest:

GERALD J. MOSSINGHOFF

*Attesting Officer*     *Commissioner of Patents and Trademarks*